United States Patent
Hsu et al.

(10) Patent No.: US 8,993,431 B2
(45) Date of Patent: Mar. 31, 2015

(54) METHOD OF FABRICATING BUMP STRUCTURE

(75) Inventors: Chun-Lei Hsu, Keelung (TW); Ming-Che Ho, Tainan (TW); Ming-Da Cheng, Jhubei (TW); Chung-Shi Liu, Shin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 270 days.

(21) Appl. No.: 12/778,610

(22) Filed: May 12, 2010

(65) Prior Publication Data
US 2011/0278716 A1 Nov. 17, 2011

(51) Int. Cl.
*H01L 21/44* (2006.01)
*H01L 23/00* (2006.01)

(52) U.S. Cl.
CPC .............. *H01L 24/11* (2013.01); *H01L 24/03* (2013.01); *H01L 24/05* (2013.01); *H01L 24/13* (2013.01); *H01L 2924/01012* (2013.01); *H01L 2924/01013* (2013.01); *H01L 2924/01022* (2013.01); *H01L 2924/01025* (2013.01); *H01L 2924/01029* (2013.01); *H01L 2924/0103* (2013.01); *H01L 2924/01032* (2013.01); *H01L 2924/01033* (2013.01); *H01L 2924/01038* (2013.01); *H01L 2924/01046* (2013.01); *H01L 2924/01047* (2013.01); *H01L 2924/01049*

(Continued)

(58) Field of Classification Search
USPC .......................................................... 438/613
See application file for complete search history.

(56) References Cited

U.S. PATENT DOCUMENTS 6,413,851 B1 * 7/2002 Chow et al. ................... 438/613
6,501,169 B1 12/2002 Aoki et al.
(Continued)

FOREIGN PATENT DOCUMENTS

CN 1547769 11/2004
CN 101075595 11/2007
(Continued)

OTHER PUBLICATIONS

Office Action dated Oct. 19, 2012 from corresponding application No. 201010266857.X.
(Continued)

*Primary Examiner* — Zandra Smith
*Assistant Examiner* — Andre' C Stevenson
(74) *Attorney, Agent, or Firm* — Lowe Hauptman & Ham, LLP

(57) ABSTRACT

A method for fabricating bump structure forms an under-bump metallurgy (UBM) layer in an opening of an encapsulating layer, and then forms a bump layer on the UBM layer within the opening of the encapsulating layer. After removing excess material of the bump layer from the upper surface of the encapsulating layer, the encapsulating layer is removed till a top portion of the bump layer protrudes from the upper surface of the encapsulating layer.

20 Claims, 4 Drawing Sheets

(52) U.S. Cl.
CPC ......... (2013.01); *H01L 2924/01073* (2013.01); *H01L 2924/01078* (2013.01); *H01L 2924/01079* (2013.01); *H01L 2924/01082* (2013.01); *H01L 2924/04941* (2013.01); *H01L 2924/19041* (2013.01); *H01L 2224/1161* (2013.01); *H01L 2224/1308* (2013.01); *H01L 2224/13005* (2013.01); *H01L 2224/03424* (2013.01); *H01L 2224/03464* (2013.01); *H01L 2224/05571* (2013.01); *H01L 2224/1145* (2013.01); *H01L 2224/11452* (2013.01); *H01L 2224/11462* (2013.01); *H01L 2224/1148* (2013.01); *H01L 2224/13022* (2013.01); *H01L 2224/131* (2013.01); *H01L 2224/13109* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2924/00013* (2013.01); *H01L 2924/01019* (2013.01); *H01L 2924/01023* (2013.01); *H01L 2924/01024* (2013.01); *H01L 2924/0104* (2013.01); *H01L 2924/014* (2013.01); *H01L 2224/11616* (2013.01); *H01L 2224/05572* (2013.01); *H01L 2924/13091* (2013.01)

USPC ........................................................ 438/613

(56) References Cited

U.S. PATENT DOCUMENTS

| | | | |
|---|---|---|---|
| 6,936,923 | B2 | 8/2005 | Lin et al. |
| 7,456,090 | B2 | 11/2008 | Chang et al. |
| 2002/0151164 | A1* | 10/2002 | Jiang et al. ................ 438/613 |
| 2003/0133115 | A1* | 7/2003 | Chen et al. ................ 356/401 |
| 2003/0134496 | A1 | 7/2003 | Lee et al. |
| 2006/0043364 | A1* | 3/2006 | Jiang et al. ................ 257/48 |
| 2008/0054461 | A1* | 3/2008 | Lang et al. ................ 257/738 |
| 2009/0096098 | A1* | 4/2009 | Yang et al. ................ 257/738 |
| 2010/0007017 | A1* | 1/2010 | Wei et al. ................ 257/737 |
| 2011/0189848 | A1* | 8/2011 | Ewert et al. ................ 438/612 |

FOREIGN PATENT DOCUMENTS

| | | |
|---|---|---|
| CN | 101106114 | 1/2008 |
| CN | 101131948 | 2/2008 |

OTHER PUBLICATIONS

Office Action dated Nov. 6, 2013 from corresponding application No. CN 011010266857.X.

* cited by examiner

METHOD OF FABRICATING BUMP STRUCTURE

TECHNICAL FIELD

The present disclosure relates to the fabrication of semiconductor devices, and more particularly, to a method of forming a bump structure.

BACKGROUND

Modern integrated circuits are made up of literally millions of active and/or passive devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. In a typical bumping process, interconnect structures are formed on metallization layers, followed by the formation of under-bump metallurgy (UBM), and the mounting of solder balls.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in that order, on the I/O pad. The bumps themselves, based on the material used, are classified as solder bumps, gold bumps, copper pillar bumps and bumps with mixed metals. Recently, copper interconnect post technology has been proposed. Instead of using a solder bump, the electrical component is connected to a substrate by means of a copper post. The copper interconnect post technology achieves finer pitch with minimum probability of bump bridging, reduces the capacitance load for the circuits, and allows the electrical component to perform at higher frequencies. A solder alloy is still necessary for capping the bump structure and joining electrical components as well.

Usually, in wet etching the UBM layer, an isotropic etch profile is produced, in which the etching is at the same rate in all directions, leading to undercutting of the etched UBM material. This action results in an undesirable loss of line width. The undercut caused by wet etching process will induce the stress concentration, resulting in bump sidewall delamination, bump crack and bump bridge in fine pitch designs. Although the undercut is an inherent result of the etching process, the undercut is detrimental to the long-term reliability of the interconnection. The undercut compromises the integrity of the solder bump structure by weakening the bond between the solder bump and the bonding pad of the chip, thereby leading to premature failure of the chip.

DETAILED DESCRIPTION OF ILLUSTRATIVE EMBODIMENTS

This disclosure provides a bump process used in semiconductor devices having solder bumps, Cu posts, post passivation interconnects, and/or through-silicon vias (TSVs) fabricated thereon, applied to flip-chip assembly, wafer-level chip scale package (WLCSP), three-dimensional integrated circuit (3D-IC) stack, and/or any advanced package technology fields. Embodiments described herein relate to the method of forming an under-bump metallization (UBM) layer for use with semiconductor devices. In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, cross-sectional diagrams of FIGS. 1 to 6 depicting various stages of an exemplary embodiment of a method forming a bump structure.

Figure 1:
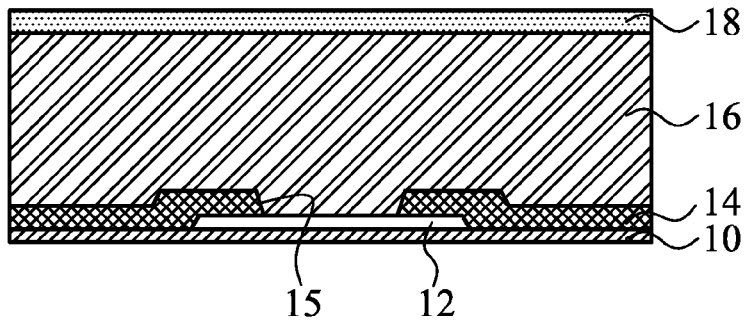
FIGS. 1~6 are cross-sectional diagrams depicting various stages of an exemplary embodiment of forming a bump structure.

With reference to FIG. 1, an example of a substrate 10 used for bump fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., static random access memory, or SRAM), radio frequency (RF) device, input/output (I/O) device, system-on-chip (SoC) device, combinations thereof, and other suitable types of devices.

In some embodiments, the substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. A contact region 12 is a top metallization layer formed in a top-level inter-layer dielectric layer, which is a portion of conductive routes and has an exposed surface treated by a planarization process, such as chemical mechanical polishing (CMP), if necessary. Suitable materials for the conductive region 12 may include, but are not limited to, for example copper (Cu), aluminum (Al), AlCu, copper alloy, or other mobile conductive materials. In one embodiment, the contact region 12 is a metal pad region 12, which may be used in the bonding process to connect the integrated circuits in the respective chip to external features.

FIG. 1 also depicts a passivation layer 14 formed on the substrate 10, which has a first opening 15 exposing a portion of the metal pad region 12 for allowing subsequent bump formation. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), or the like. Furthermore, other relatively soft, often organic, dielectric materials can also be used. In one embodiment, the passivation layer 14 is a dual-layer structure including a dielectric layer and a polymer layer.

FIG. 1 further depicts an encapsulating layer 16 formed on the substrate 10 to cover the passivation layer 14 and fill the first opening 15. The encapsulating layer 16 is formed of a non-conductive material and thereby prevents adjacent connections from being electrically shorted to one another. The encapsulating layer 16 also protects the substrate 10 from, but not limited to, moisture, ionic contaminants, radiation, or hostile operating environments such as, for example, thermal and mechanical conditions, shock, or vibration. In one embodiment, the encapsulating layer 16 is formed of an underfill material, which may comprise, for example, anhydride-cured or amine-cured epoxy materials, epoxy polymer, silsesquioxane-based epoxy resins, etc. The underfill material exhibits a high degree of capillary flow so as to allow penetration of the underfill material on the resulting structure of the substrate. The underfill material also helps to absorb stresses resulting from, among other factors, a thermal expansion mismatch which may exist between the integrated circuit substrate and the package substrate. In one embodiment, the encapsulating layer 16 is formed of a dielectric material, which may comprises $SiO_2$, $SiO_xN_y$, $Si_3N_4$, or low-k material with a dielectric constant k less than 3.9.

Figure 2:
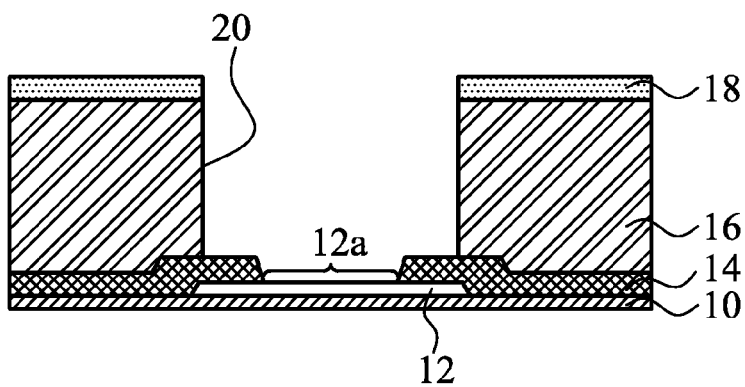

Next, a mask layer 18 is provided on the encapsulating layer 16. In some embodiments, the mask layer 18 is a dry film or a photoresist film through the steps of coating, curing, descum or the like, followed by lithography technology and/or etching processes such as a dry etch and/or a wet etch process. Thereby, using the patterned mask layer 18 with lithography technology and/or etching processes, a second opening 20 is formed in the encapsulating layer 16 to expose a portion 12a of the metal pad region 12 as depicted in FIG. 2.

In some embodiments, the diameter of the second opening 20 is greater or equal to the diameter of first opening 15. Depending on the process control, in at least one embodiment, the second opening 20 may expose a portion of the passivation layer 14 adjacent to the exposed portion 12a of the metal pad region 12.

Figure 3:
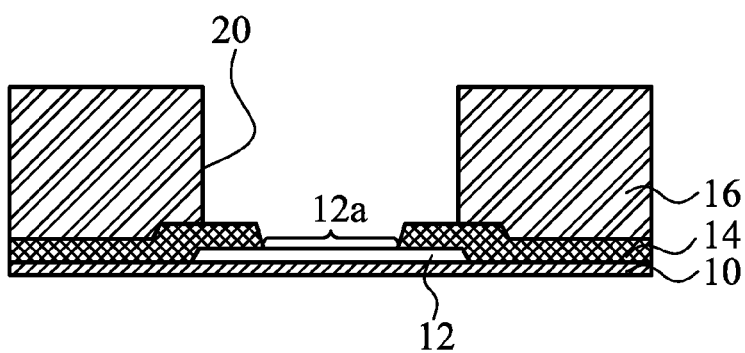

Next, as shown in FIG. 3, the mask layer 18 is removed from the encapsulating layer 16. In the case the mask layer 18 is a dry film, it may be removed using an alkaline solution. If the mask layer 18 is formed of photoresist, it may be removed using acetone, n-methyl pyrrolidone (NMP), dimethyl sulfoxide (DMSO), aminoethoxy ethanol, and the like.

Figure 4:
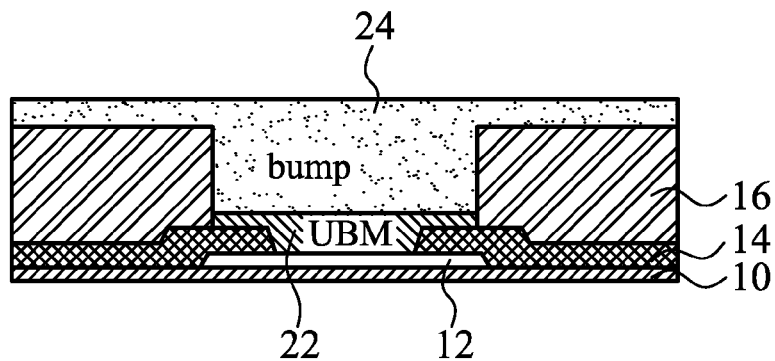

Referring to FIG. 4, the formation of an under-bump-metallurgy (UBM) layer 22 is performed in the second opening 20 of the encapsulating layer 16. The UBM layer 22 is selectively formed on the exposed portion 12a of the metal pad region 12 within the second opening 20 of the mask layer 18 through an electroless deposition or an immersion technique. In the case the passivation layer 14 is exposed in the second opening 20, the UBM layer 22 may be formed on the exposed portion of the passivation layer 14 within the second opening 20. In one embodiment, the UBM layer 22 includes a diffusion barrier layer, which is formed of titanium (Ti), titanium nitride (TiN), tantalum nitride (TaN), tantalum (Ta), or the like, with a thickness of between about 500 and 2000 Angstrom. In one embodiment, the UBM layer 22 includes a copper layer with a thickness about 3000~5000 Angstrom, although the thickness may be greater or smaller. For example, a copper layer with a thickness about 1~10 μm.

Then the formation of a bump layer 24 is performed on the UBM layer 22 to fill the second opening 20. The bump layer 24 is a conductive material layer with solder wettability, which may be formed through any number of suitable techniques, including physical vapor deposition (PVD), chemical vapor deposition (CVD), electrochemical deposition (ECD), molecular beam epitaxy (MBE), atomic layer deposition (ALD), electroplating, and the like. It is noted that in some embodiments, such as those that deposit a conformal layer over the entire surface of the substrate 10 (e.g., PVD and CVD), it may be desirable to perform an etching or planarization process (e.g., a chemical mechanical polishing (CMP)) to remove excess conductive material from the surface of the encapsulating layer 16. The bump layer 24 has a thickness greater than 40 μm. For example, the bump layer 24 is of about 40~50 μm thickness, or about 40~70 μm thickness, although the thickness may be greater or smaller.

In some embodiments, the bump layer 24 is a solder layer is made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. The solder volume does not change during thermal annealing. In some embodiments, the bump layer 24 is a metal layer formed of any suitable conductive material, including Cu, Ni, Pt, Al, combinations thereof, or the like. For example, a copper (Cu) layer that is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In some embodiments, an electro-chemical plating (ECP) process is carried out to form the Cu layer.

Figure 4A:
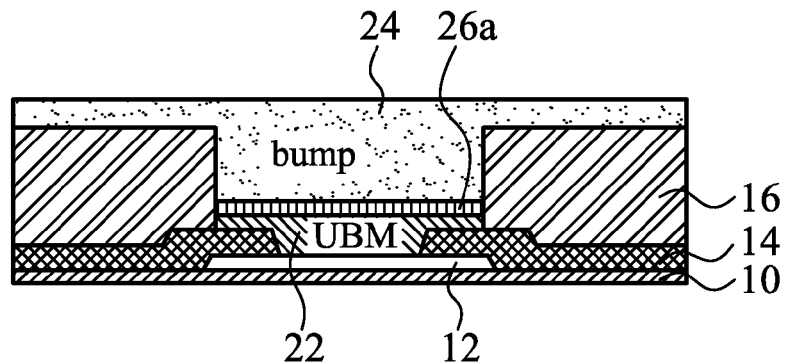
Figure 4B:
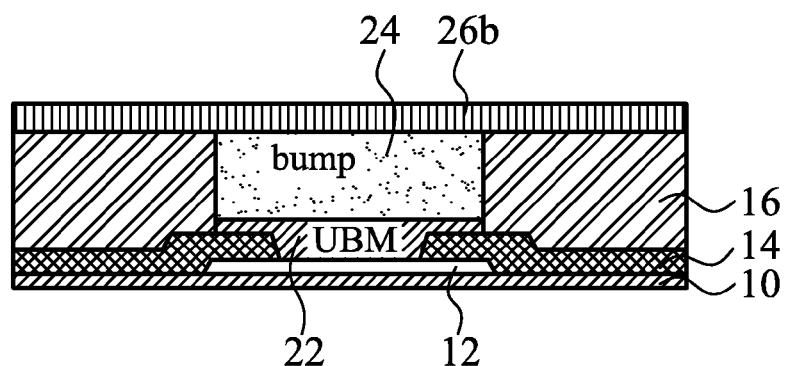
Figure 4C:
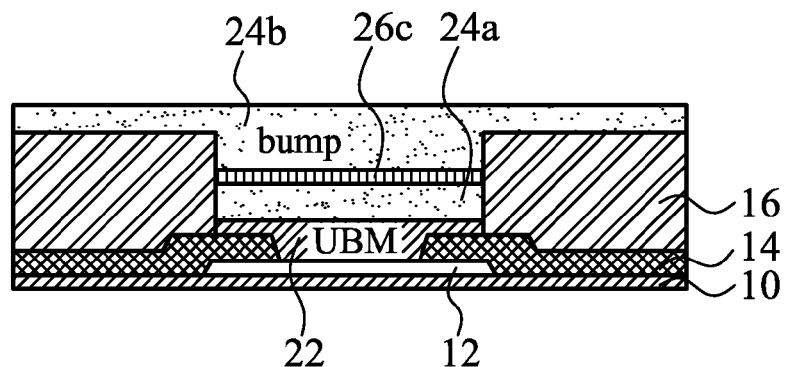

In some embodiments, the bump layer 24 further includes an optional cap layer that could act as a barrier layer to prevent copper in the bump layer 24 from diffusing into bonding material so at to increase the reliability and bonding strength of the package. The cap layer may be formed of copper, nickel (Ni), gold (Au), silver (Ag), palladium (Pd), indium (In), nickel-palladium-gold (NiPdAu), nickel-gold (NiAu), other similar materials, or alloy. The cap layer is a multi-layered structure or a single-layered structure with a thickness about 1~5 μm. As depicted in FIG. 4A, a first cap layer 26a is formed between the bump layer 24 and the UBM layer 22. In the case the bump layer 24 is a solder layer, the first cap layer 26a includes a copper layer, a nickel layer, or a combination thereof. As depicted in FIG. 4B, a second cap layer 26b is formed on the top surface of the bump layer 24. In the case the bump layer 24 is a copper layer of about 40~50 μm thickness, the second cap layer 26b includes a nickel layer, a gold layer, a tin layer, or combinations thereof. As depicted in FIG. 4C, a third cap layer 26c is inserted between a first portion 24a of the bump layer 24 and a second portion 24b of the bump layer 24. In the case the first portion 24a is a copper layer of about 40~50 μm thickness and the second portion 24b is a solder layer of about 5~10 μm, the third cap layer 26b includes a nickel layer, a gold layer, or a combination thereof.

Figure 5:
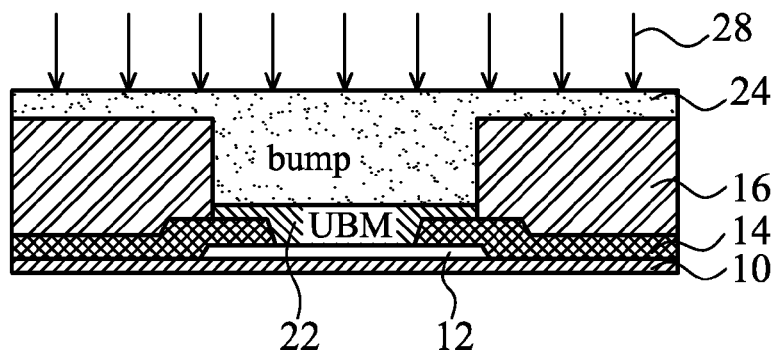

With reference to FIG. 5, an etching back process (e.g., a dry etching process) or planarization process 28 (e.g., a chemical mechanical polishing (CMP)) is performed to remove excess conductive material from the top surface of the encapsulating layer 16, till the upper surface of the bump layer 24 is substantially coplanar with the upper surface of the encapsulating layer 16.

Figure 6:
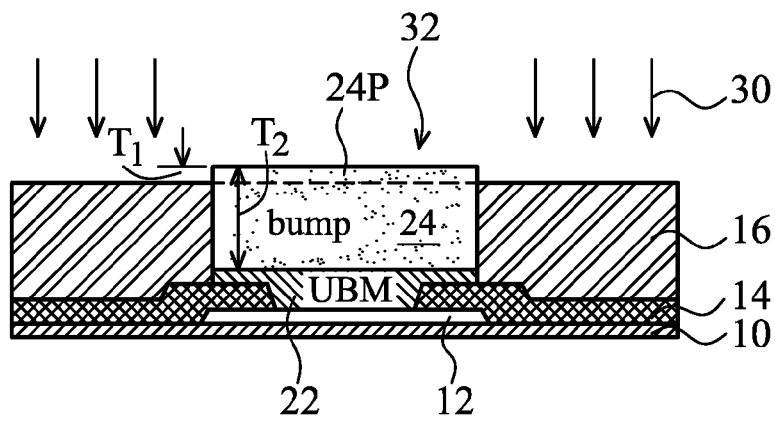

For allowing subsequent directly-jointing a pre-solder layer provided on a package substrate, the upper surface of the encapsulating layer 16 is further etched through another etching back process or planarization process 30 till a top portion 24p of the bump layer 24 protrudes from the encapsulating layer 16 as depicted in FIG. 6. The top portion 24p protruding from the upper surface of the encapsulating layer 16 has a thickness $T_1$, and the bump layer 24 has a thickness $T_2$, wherein a ratio $T_1/T_2$ is about 0~0.98. In one embodiment, a buffing process is performed to lightly polish the substrate 10 so that the resulting thickness of the encapsulating layer 16 achieves the final target thickness. It is performed for a pre-determined polish time using a soft polish pad, and hence eliminates the defects and scratches caused by the high-rate and low-rate polishes.

The completed bump structure 32 includes the UBM layer 22 embedded in the encapsulating layer 16, and the bump layer 24 partially embedded in the encapsulating layer 16. The top of the bump layer 24 slightly protrudes from the encapsulating layer 16, which can directly joint a pre-solder layer in subsequent packaging process. A solder reflow process may be optionally performed on the bump layer 24 depending on the material used to form thereof. The substrate 10 is then sawed and packaged onto a package substrate, or another die, with solder balls or Cu bumps mounted on a pad on the package substrate or the other die.

Compared with conventional bump processes, this disclosure provides a method of forming the encapsulating layer 16 with the second opening 20 on the passivation layer 14, selectively forming the UBM layer 22 in the second opening 20 of the encapsulating layer 16 and then forming the bump layer 24 in the opening 20 of the encapsulating layer 16, resulting in a more robust bump structure 32 with enhanced bump strength and reliability. There is no need to perform an UBM etching process, thus the UBM undercut issue is eliminated. Also, since the encapsulating layer 16 replaces the conventional photoresist mask layer, it is not necessary to perform the step of removing the encapsulating layer 16 after the bump formation. This can reduce the bump bridge issue and will be applicable to fine pitch bump schemes or high bump density designs. Moreover, the bump layer 24 with the top portion 24p protruding from the encapsulating layer 16 can directly connect with a pre-solder layer of a package substrate.

Figure 7:
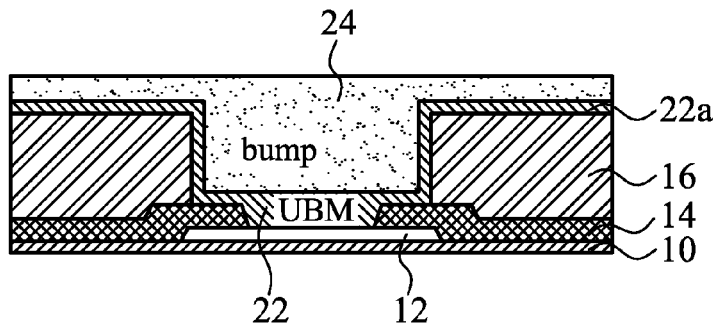
FIGS. 7~9 are cross-sectional diagrams depicting various stages of another exemplary embodiment of forming a bump structure.
Figure 8:
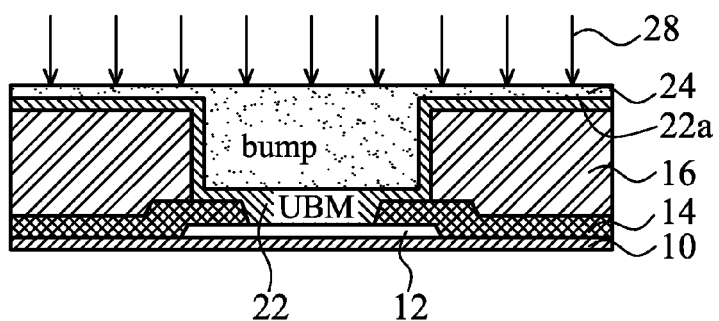
Figure 9:
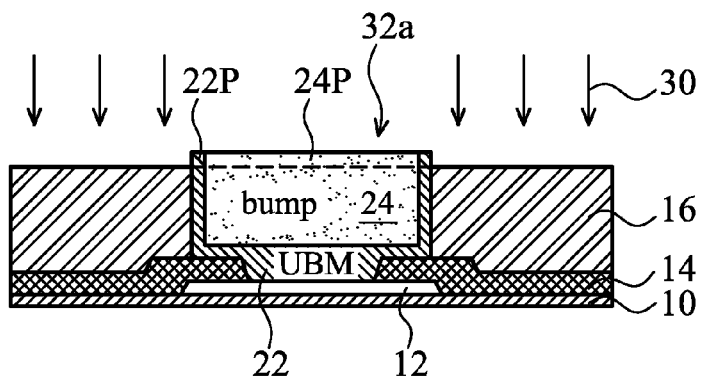

FIGS. 7 to 9 are cross-sectional diagrams depicting various stages of an exemplary embodiment of a method of forming a bump structure, while explanation of the same or similar portions to the description in FIGS. 1 to 6 will be omitted.

With reference to FIG. 7, after the formation of the encapsulating layer 16 with the second opening 20, the formation of an under-bump-metallurgy (UBM) layer 22a is performed in the second opening 20 of the encapsulating layer 16 to contact the metal pad region 12. The UBM layer 22a is formed through any number of suitable techniques, including physical vapor deposition (PVD), chemical vapor deposition (CVD), electrochemical deposition (ECD), atomic layer deposition (ALD), electroplating, or the like, such as those that deposit a conformal layer over the entire surface of the substrate 10. Thus the formation of the UBM layer 22a lines the bottom and sidewalls of the second opening 20 and extends to the upper surface of the encapsulating layer 16.

Then the formation of the bump layer 24 is performed on the UBM layer 22a to fill the second opening 20. The bump layer 24 is a conductive material layer with solder wettability, which may be formed through any number of suitable techniques, including PVD, CVD, ECD, MBE, ALD, electroplating, and the like. In some embodiments, the bump layer 24 is a solder layer is made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. In some embodiments, the bump layer 24 is a metal layer formed of any suitable conductive material, including Cu, Ni, Pt, Al, combinations thereof, or the like. In some embodiments, the bump layer 24 further includes an optional cap layer that could act as a barrier layer to prevent copper in the bump layer 24 from diffusing into bonding material so at to increase the reliability and bonding strength of the package.

With reference to FIG. 8, an etching back process (e.g., a dry etching process) or planarization process 28 (e.g., a chemical mechanical polishing (CMP)) is performed to remove excess conductive material from the upper surface of the encapsulating layer 16, till the upper surfaces of the bump layer 24 and the UBM layer 22a are substantially coplanar with the upper surface of the encapsulating layer 16.

For allowing subsequent directly-jointing a pre-solder layer provided on a package substrate, the top surface of the encapsulating layer 16 is further etched through another etching back process or planarization process 30 till the top surfaces of the bump layer 24 and the UBM layer 22a protrude from the encapsulating layer 16 as depicted in FIG. 9. In one embodiment, a buffing process is performed to lightly polish the substrate 10 so that the resulting thickness of the encapsulating layer 16 achieves the final target thickness. It is performed for a pre-determined polish time using a soft polish pad, and hence eliminates the defects and scratches caused by the high-rate and low-rate polishes.

The completed bump structure 32a includes the bump layer 24 partially embedded in the encapsulating layer 16 with a top portion 24p protruding from the encapsulating layer 16, and the UBM layer 22a lining the bottom and sidewalls of the bump layer 24 and partially embedded in the encapsulating layer 16 with a top portion 22p protruding from the encapsulating layer 16. The top portions 24p and 22p of the bump structure 32a slightly protrude from the encapsulating layer 16, which can directly jointing a pre-solder layer in subsequent packaging process.

In the preceding detailed description, the disclosure is described with reference to specific exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concept as expressed herein.

What is claimed is:

1. A method of forming a semiconductor device, comprising:
    forming an encapsulating layer over a semiconductor substrate having a metal pad region, wherein the encapsulating layer has an opening exposing a portion of the metal pad region;
    forming an under-bump metallurgy (UBM) layer overlying the exposed portion of the metal pad region within the opening of the encapsulating layer;
    forming a bump layer overlying the UBM layer to fill the opening of the encapsulating layer and extend to the upper surface of the encapsulating layer;
    removing the bump layer from the upper surface of the encapsulating layer; and
    removing the upper surface of the encapsulating layer until a top portion of the bump layer protrudes from the encapsulating layer, wherein removing the upper surface of the encapsulating layer comprises initiating a removal process on the upper surface of the encapsulating layer and a coplanar top surface of the top portion of the bump layer.

2. The method of claim 1, wherein the encapsulating layer is formed of an underfill material or a dielectric material.

3. The method of claim 1, wherein the bump layer comprises a solder layer.

4. The method of claim 1, wherein the bump layer comprises a copper layer of a thickness greater than 40 µm.

5. The method of claim 1, wherein the UBM layer comprises a titanium layer, a copper layer, or a combination thereof.

6. The method of claim 1, wherein removing the upper surface of the encapsulating layer further comprises reducing a thickness of the encapsulating layer to form a ratio of a thickness of the top portion of the bump layer to a thickness of the bump layer in a range from 0 to 0.98.

7. A method of forming a semiconductor device, comprising:
    forming an encapsulating layer over a semiconductor substrate having a metal pad region, wherein the encapsulating layer has an opening exposing a portion of the metal pad region;
    forming an under-bump metallurgy (UBM) layer to line the bottom and sidewalls of the opening of the encapsulating layer and extend to the upper surface of the encapsulating layer;
    forming a bump layer overlying the UBM layer, wherein the bump layer fills the opening of the encapsulating layer and overlies the upper surface of the encapsulating layer;
    removing the bump layer and the UBM layer from the upper surface of the encapsulating layer; and
    removing the upper surface of the encapsulating layer until a top portion of the bump layer protrudes from the encapsulating layer, wherein removing the upper surface of the encapsulating layer comprises initiating a removal process on the upper surface of the encapsulating layer and a coplanar top surface of the top portion of the bump layer.

8. The method of claim 7, wherein the encapsulating layer is formed of an underfill material or a dielectric material.

9. The method of claim 7, wherein the bump layer comprises a solder layer.

10. The method of claim 7, wherein the bump layer comprises a copper layer of a thickness greater than 40 µm.

11. The method of claim 7, wherein the UBM layer comprises a titanium layer, a copper layer, or a combination thereof.

12. The method of claim 7, wherein removing the upper surface of the encapsulating layer further comprises reducing a thickness of the encapsulating layer to form a ratio of a thickness of the top portion of the bump layer to a thickness of the bump layer in a range from 0 to 0.98.

13. A semiconductor device, comprising:
    a semiconductor substrate comprising a metal pad region;
    a passivation layer overlying the semiconductor substrate having a first opening defined therein for exposing a first portion of the metal pad region;
    an encapsulating layer overlying the passivation layer having a second opening defined therein for exposing the first portion of the metal pad region;
    a bump layer partially formed in the second opening and electrically connected to the first portion of the metal pad region, wherein a top portion of the bump layer protrudes from the upper surface of the encapsulating layer; and
    an under-bump metallurgy (UBM) layer formed in the second opening and electrically connected to the first portion of the metal pad region, wherein the UBM layer is formed between the bump layer and the first portion of the metal pad region and between the bump layer and the encapsulating layer, and the UBM layer is on the passivation layer and has an outermost surface aligned with a sidewall of the second opening.

14. The semiconductor device of claim 13, wherein the UBM layer comprises a top portion protruding from the upper surface of the encapsulating layer.

15. The semiconductor device of claim 13, wherein the encapsulating layer is formed of an underfill material or a dielectric material.

16. The semiconductor device of claim 13, wherein the bump layer comprises a solder layer.

17. The semiconductor device of claim 13, wherein the bump layer comprises a copper layer of a thickness greater than 40 µm.

18. The semiconductor device of claim 13, wherein a ratio of a thickness of the top portion of the bump layer to a thickness of the bump layer is in a range from 0 to 0.98.

19. The semiconductor device of claim 13, further wherein a top surface of the UBM layer is substantially level with a top surface of the bump layer.

20. The semiconductor device of claim 13, wherein the bump layer comprises a cap layer.

* * * * *